(12) United States Patent
Galal et al.

(10) Patent No.: US 8,294,518 B2
(45) Date of Patent: Oct. 23, 2012

(54) CLASS-AB/B AMPLIFIER AND QUIESCENT CONTROL CIRCUIT FOR IMPLEMENTATION WITH SAME

(75) Inventors: Sherif Galal, Irvine, CA (US); Alex Jianzhong Chen, Irvine, CA (US); Khaled Abdelfattah, Irvine, CA (US); Todd L. Brooks, Laguna Beach, CA (US)

(73) Assignee: Broadcom Corporation, Irvine, CA (US)

( * ) Notice: Subject to any disclaimer, the term of this patent is extended or adjusted under 35 U.S.C. 154(b) by 0 days.

(21) Appl. No.: 12/807,403

(22) Filed: Sep. 3, 2010

(65) Prior Publication Data

US 2012/0056672 A1    Mar. 8, 2012

(51) Int. Cl.
*H03F 3/26*    (2006.01)
(52) U.S. Cl. ........................................ 330/267; 330/265
(58) Field of Classification Search .................. 330/267, 330/262–264, 269
See application file for complete search history.

(56) References Cited

U.S. PATENT DOCUMENTS 7,145,393 B1 *  12/2006  Lubbers ..................... 330/264
7,304,538 B2    12/2007  Song

* cited by examiner

*Primary Examiner* — Khanh V Nguyen
(74) *Attorney, Agent, or Firm* — Farjami & Farjami LLP

(57) ABSTRACT

Disclosed is a Class-AB/B amplifier comprising a first output stage including a first plurality of amplification devices and a second output stage including a second plurality of amplification devices. According to one embodiment, the first output stage operates when the Class-AB/B amplifier is in a quiescent state and the second output stage operates when the Class-AB/B amplifier is in an active state. The Class-AB/B amplifier also comprises a level shifting circuit that adjusts a control voltage of the second output stage, where the level shifting circuit is adapted to activate the second output stage when the Class-AB/B amplifier enters the active state. Embodiments of the Class-AB/B amplifier may include a level shifting circuit that implements either a fixed or signal-dependent level shift, and a quiescent control circuit that substantially eliminates any systematic offset arising from the active feedback circuit inside the replica bias circuit.

18 Claims, 4 Drawing Sheets

CLASS-AB/B AMPLIFIER AND QUIESCENT CONTROL CIRCUIT FOR IMPLEMENTATION WITH SAME

BACKGROUND OF THE INVENTION

1. Field of the Invention

The present invention is generally in the field of electronic circuits and systems. More specifically, the present invention is in the field of amplifier circuits and systems.

2. Background Art

Audio power amplifiers form an important part of many mobile communications devices, such as cellular telephones and MP3 players. Because these mobile communications devices are typically battery-operated, it is highly desirable that the audio power amplifiers implemented in such devices consume low quiescent currents in order to extend the life of the battery. For example, a Class-A amplifier continuously consumes a large current even in the absence of an audio signal, which makes it unattractive for battery-operated handheld devices. An alternative conventional amplifier, the Class-B amplifier, although designed so as not to consume any current when there is no signal, suffers from large cross-over distortion. This cross-over distortion may significantly degrade the output signal quality of a Class-B amplifier implemented to provide audio amplification.

A conventional approach to achieving a compromise between the relatively high fidelity of the Class-A design and the efficiency achieved by Class-B amplifiers is the Class AB amplifier, which consume a small current in the quiescent state to improve cross-over distortion. However, typical Class-AB amplifiers employ large output-stage transistors that are sized to handle peak load currents. This can create large variations in the output stage currents due to process mismatch, which may cause a stability problem if the output stage current is significantly reduced. In addition, the large output stage transistors and the small quiescent current reduce the headroom allocated to the first stage.

Thus, mobile communications devices may benefit from an audio amplifier that combines the good cross-over distortion performance of Class-AB amplifiers and the low quiescent current of Class-B amplifiers, without incurring stability problems due to current variations or headroom limitations. Accordingly, there is a need to overcome the drawbacks and deficiencies in the art by providing a Class-AB/B amplifier and a quiescent control circuit for implementation with the Class-AB/B amplifier.

SUMMARY OF THE INVENTION

The present application is directed to a Class-AB/B amplifier and quiescent control circuit for implementation with same, substantially as shown in and/or described in connection with at least one of the figures, as set forth more completely in the claims.

DETAILED DESCRIPTION OF THE INVENTION

Figure 1:
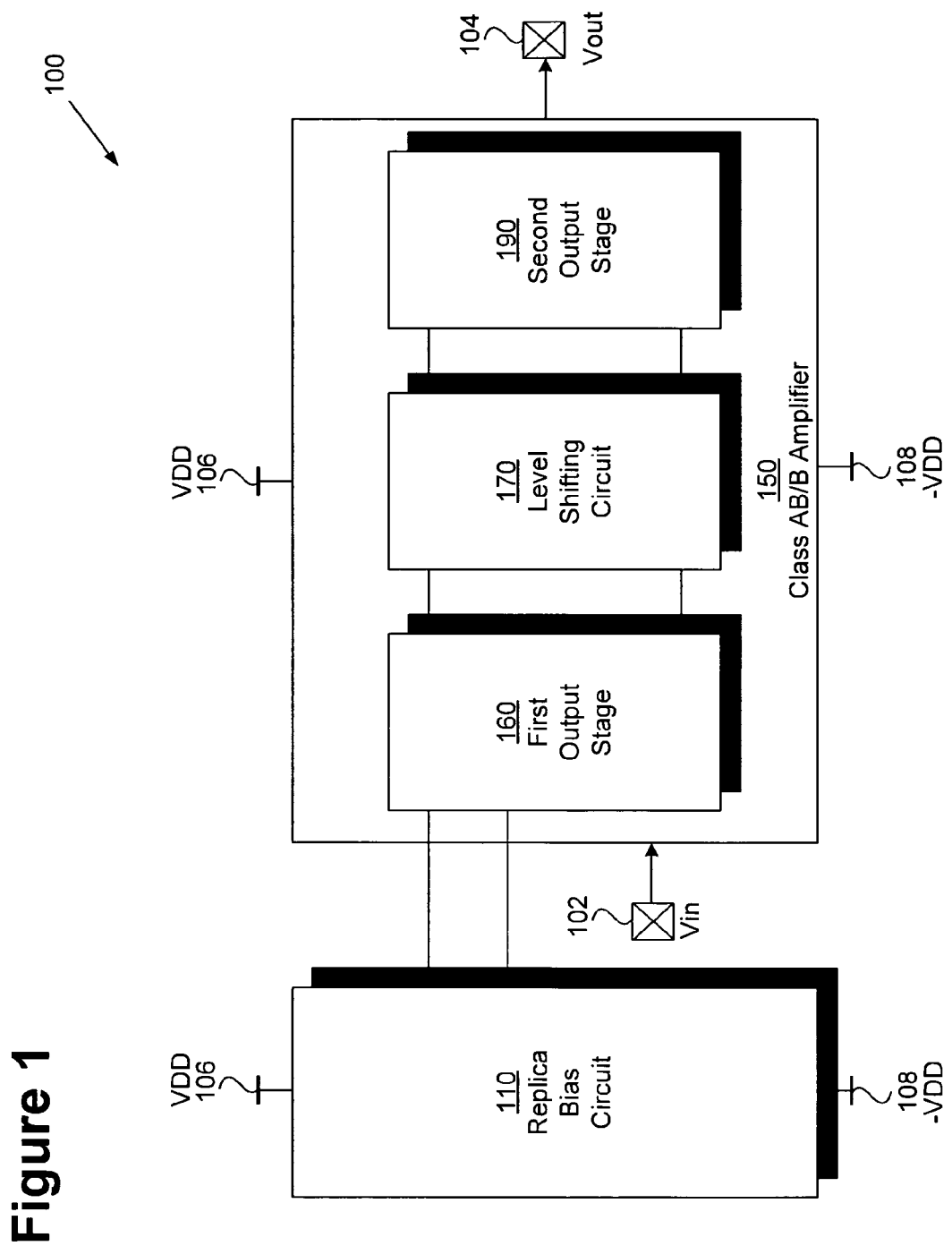
FIG. 1 illustrates a block diagram that includes an amplification system that employs a Class-AB/B amplifier, according to one embodiment of the present invention.

The present invention is directed to a Class-AB/B amplifier and quiescent control circuit suitable for implementation with the Class-AB/B amplifier. Although the present invention is described with respect to specific embodiments, the principles of the invention, as defined by the claims appended herein, can obviously be applied beyond the specifically described embodiments of the invention described herein. Moreover, in the description of the present invention, certain details have been left out in order not to obscure the inventive aspects of the invention. The details left out are within the knowledge of a person of ordinary skill in the art.

The drawings in the present application and their accompanying detailed description are directed to merely exemplary embodiments of the invention. To maintain brevity, other embodiments of the invention, which use the principles of the present invention are not specifically described in the present application and are not specifically illustrated by the present drawings. It should be borne in mind that, unless noted otherwise, like or corresponding elements among the figures are indicated by like or corresponding reference numerals. Moreover, the drawings and illustrations in the present application are generally not to scale, and are not intended to correspond to actual relative dimensions.

Power efficient amplifiers form an integral part of many mobile communications devices like cellular telephones. Class-B amplifiers that consume no current in the absence of the signal, and Class-AB amplifiers that exhibit better crossover distortion each present potentially desirable configurations to amplify audio signals, for example. However, despite potential efficiencies over Class-A amplifiers, conventional Class-AB and Class-B amplifiers have their own shortcomings. For instance, conventional Class-B amplifiers often have a cross-over distortion that can severely degrade output signal quality when the output stage devices of the amplifier are activated. Moreover, conventional Class-AB amplifiers typically require large output stage devices that must be sized to handle peak load currents. These large output stage devices present a large parasitic capacitance, which can cause the amplifier to be unstable. To avoid those stability problems, the amplifier must be redesigned for reduced bandwidth. In addition, the large output stage device can undesirably limit the headroom allocated for the first stage in a conventional Class-AB amplifier. Moreover, in a quiescent state, the large output stage devices amplify the variation in quiescent current arising from random process mismatch among the small biasing devices implemented in the quiescent control circuit, which can further destabilize the amplifier. It is therefore desirable to have the high power efficiency of conventional Class-AB and Class-B amplifiers without the drawbacks of these conventional amplifiers.

FIG. 1 illustrates a block diagram that includes amplification system 100, according to one embodiment of the present invention, capable of overcoming the drawbacks and deficiencies associated with the conventional art. Amplification system 100 may be implemented as an audio amplifier in a mobile communications device, such as a cellular telephone. As shown in FIG. 1, amplification system 100 may comprise replica bias circuit 110 and Class-AB/B amplifier 150. Positive supply voltage 106 and negative supply voltage 108 may serve as supply voltages to replica bias circuit 110 and Class-AB/B amplifier 150. Each of positive supply voltage 106 and negative supply voltage 108 may correspond to a fixed voltage source generated from the main supply using a linear or switched voltage regulator, for example.

Replica bias circuit 110 may supply control voltages to the control terminals of individual devices that lie within Class-AB/B amplifier 150. Replica bias circuit 110 may also maintain stable quiescent currents in Class-AB/B amplifier 150 when Class-AB/B amplifier 150 is in a quiescent state.

Class-AB/B amplifier 150 may include a novel configuration of circuit blocks such as first output stage 160, level shifting circuit 170, and second output stage 190. Operationally, Class-AB/B amplifier 150 may amplify an input signal at input terminal 102 to provide an output signal at output terminal 104.

Figure 2:
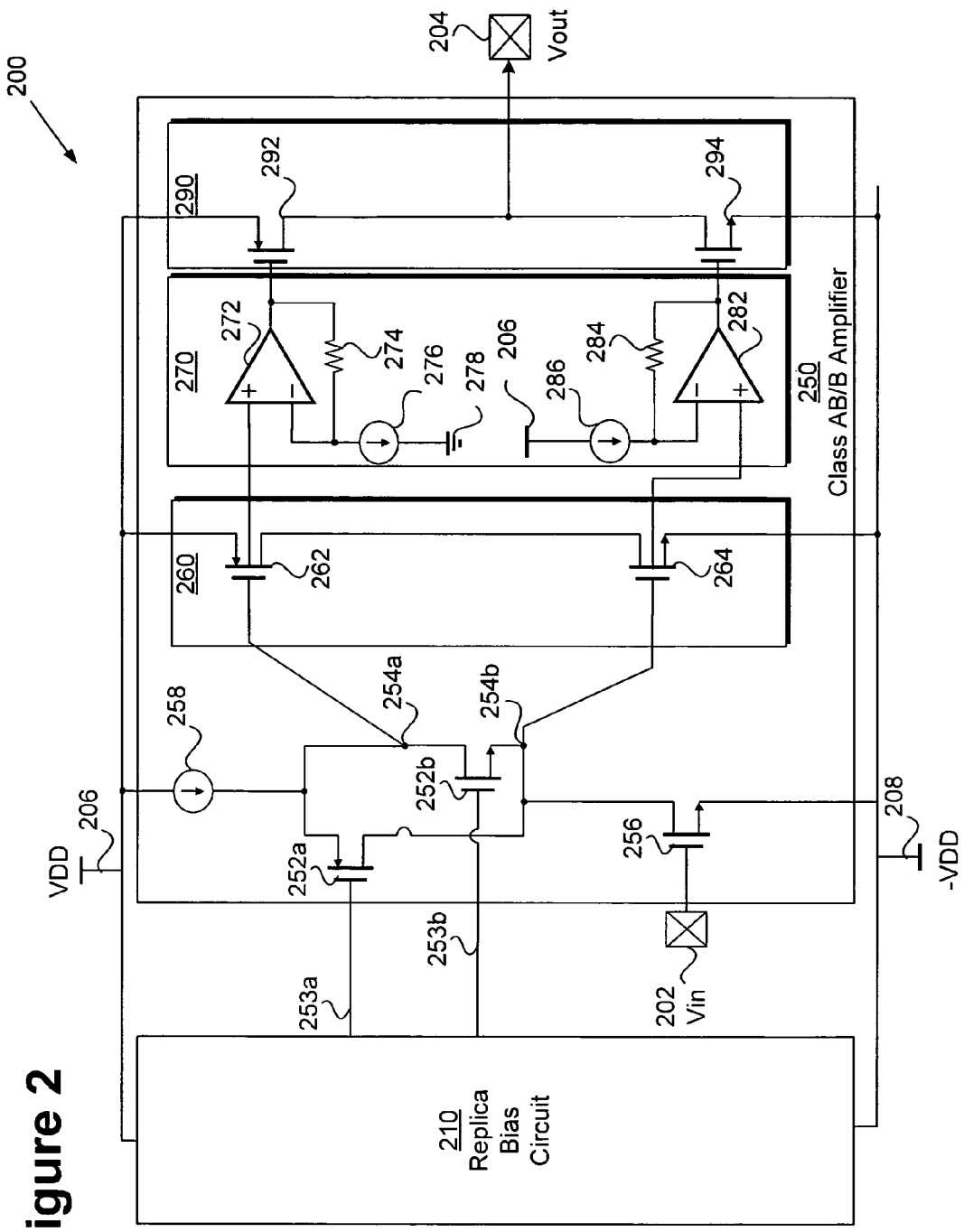
FIG. 2 shows, in more detail, an amplification system that employs a Class-AB/B amplifier along with signal-independent level shifting circuitry, according to one embodiment of the present invention.

To illustrate the functional blocks in FIG. 1 in more detail, FIG. 2 shows amplification system 200 according to one embodiment of the present invention. As shown, amplification system 200 may include replica bias circuit 210 and Class-AB/B amplifier 250, each supplied by positive supply voltage 206 and negative supply voltage 208. Class-AB/B amplifier 250 may include first output stage 260, level shifting circuit 270, and second output stage 290, and be configured to amplify an input signal at input terminal 202 to provide an output signal at output terminal 204. Replica bias circuit 210, positive supply voltage 206, negative supply voltage 208, Class-AB/B amplifier 250 including first output stage 260, level shifting circuit 270, and second output stage 290, input terminal 202, and output terminal 204 correspond respectively to replica bias circuit 110, positive supply voltage 106, negative supply voltage 108, Class-AB/B amplifier 150 including first output stage 160, level shifting circuit 170, and second output stage 190, input terminal 102, and output terminal 104, in FIG. 1.

Class-AB/B amplifier 250 may include input current source 258, first biasing device 252a, second biasing device 252b, and input device 256. Any of devices 252a, 252b, and 256 may be field-effect transistors (FETs), such as metal-oxide-semiconductor FETs (MOSFETs), for example. Biasing devices 252a and 252b may receive control voltages from replica bias circuit 210 at first bias control terminals 253a and second bias control terminal 253b, respectively. Furthermore, biasing devices 252a and 252b may supply bias voltages to first output stage 260 at terminals 254a and 254b, respectively. Input device 256 may provide a value corresponding to an amplified version of the input signal at input terminal 202 to first output stage 260. In one embodiment, first biasing device 252a may comprise a p-channel MOSFET (PMOS device), while second biasing device 252b and input device 256 may each be an n-channel MOSFET (NMOS device).

According to the embodiment shown in FIG. 2, first output stage 260 of Class-AB/B amplifier 250 includes a first plurality of amplification devices, such as first output-stage amplification device 262 and first output-stage amplification device 264. First output stage 260 may operate when Class-AB/B amplifier 250 is in a quiescent state, wherein a quiescent state is defined as a state during which Class-AB/B amplifier 250 does not drive substantial signal current to or from output terminal 204. First-stage amplification device 262 may be a PMOS device and first-stage amplification device 264 may be an NMOS device, for example.

First-stage amplification devices 262 and 264 may be sized to carry the quiescent current of Class-AB/B amplifier 250, as well as a small portion of the load currents. For example, first-stage amplification devices 262 and 264 may be sized substantially smaller than the larger amplification devices implemented as second-stage amplification devices 292 and 294. (Second-stage amplification devices 292 and 294 are discussed more thoroughly below.) Advantageously, the relatively small sizes of first-stage amplification devices 262 and 264 reduce the effects of quiescent current variations on amplifier output. The relatively small sizes of first-stage amplification devices 262 and 264 also increase signal headroom at nodes 254a and 254b in Class-AB/B amplifier 250.

Class-AB/B amplifier 250 may further comprise second output stage 290 including a second plurality of amplification devices, such as second-stage amplification device 292 and second-stage amplification device 294. Second output stage 290 may operate only when Class-AB/B amplifier 250 is in an active state, wherein an active state is defined as a state during which Class-AB/B amplifier 250 drives signal currents that are substantially larger than the quiescent current to and from output terminal 204.

Second stage amplification device 292 may be a PMOS device and second-stage amplification device 294 may be an NMOS device, for example. Second-stage amplification devices 292 and 294 may be sized to carry a majority of the load currents. For example, second-stage amplification devices 292 and 294 may be sized substantially larger than first-stage amplification devices 262 and 264. The relatively large size of second-stage amplification devices 292 and 294 may ensure that large output devices efficiently carry a majority of the load currents that flow through Class-AB/B amplifier 250.

To deactivate these larger output stage transistors in second output stage 290 in the quiescent state, e.g., second-stage amplification devices 292 and 294, Class-AB/B amplifier 250 may internally include level shifting circuit 270 to adjust a control voltage of second output stage 290. Level shifting circuit 270 may perform a first level shift at a control terminal, such as a gate terminal, of second-stage amplification device 292, and a second level shift at a control terminal, such as a gate terminal, of second-stage amplification device 294. By selectively activating second-stage amplification devices 292 and 294 only in the presence of a load current, level shifting circuit 270 may activate second output stage 290 when Class-AB/B amplifier 250 is in an active state.

In one embodiment, level shifting circuit 270 may implement a fixed level shift that does not depend on the value of the input signal. For example, level shifting circuit 270 may include first operational amplifier 272, first feedback resistor 274, first current source 276, and ground terminal 278. Level shifting circuit 270 may include a first feedback system comprising first current source 276 coupled to the negative input of first operational amplifier 272, and first feedback resistor 274 coupling the output of first operational amplifier 272 to its negative input, where first current source 276 and first feedback resistor 274 are embedded with first operational amplifier to provide the first feedback system. Also, a positive input of first operational amplifier 272 may be coupled to terminal 254a. In one embodiment, first operational amplifier 272 may be a unity gain buffer. Moreover, the value of first feedback resistor 274 and current source 276 may determine the amount of a first level shift up that level shifting circuit 270 provides.

Level shifting circuit 270 may further include second operational amplifier 282, second feedback resistor 284, second current source 286, and positive supply voltage 206. Level shifting circuit 270 may include a second feedback system comprising second current source 286 coupled to the negative input of second operational amplifier 282, and second feedback resistor 284 coupling the output of second operational amplifier 282 to its negative input, where second current source 286 and second feedback resistor 284 are embedded with second operational amplifier 282 to provide the second feedback system. A positive input of second operational amplifier 282 may be coupled to terminal 254b. In one embodiment, second operational amplifier 282 may be a unity gain buffer. Moreover, the value of second feedback resistor 284 and current source 286 may determine the amount of a second level shift that level shifting circuit 270 provides.

The level shifting implemented using resistor 274 and current source 276 for PMOS transistor 292, and resistor 284 and current source 286 for NMOS transistor 294 is embedded into the feedback systems of feedback amplifiers 272 and 284 respectively. This has at least two benefits. First the additional poles formed by resistor 274 and the gate capacitance of PMOS transistor 292, and by resistor 284 and the gate capacitance of NMOS transistor 294 is now pushed to higher frequencies, which helps to maintain the stability of Class-AB/B amplifier 250. Second, unity-gain feedback amplifiers 272 and 282 buffer the gate capacitance of large second-stage amplification devices 292 and 294 and widen the bandwidth of Class-AB/B amplifier 250.

Another embodiment of the present invention may employ a signal-dependent level shifting circuit to vary the control voltage of second output stage 290 based on the value of an input signal. One benefit of this approach is that the level shifting reduces to zero at the peaks of the signal. This helps increase the current drive capability of output devices 292 and 204, thereby making it possible to implement designs which have reduced size transistors in the second output stage 290, but which also maintain sufficient drive strength to achieve a given current drive requirement. One embodiment of such an implementation is shown in FIG. 3.

Figure 3:
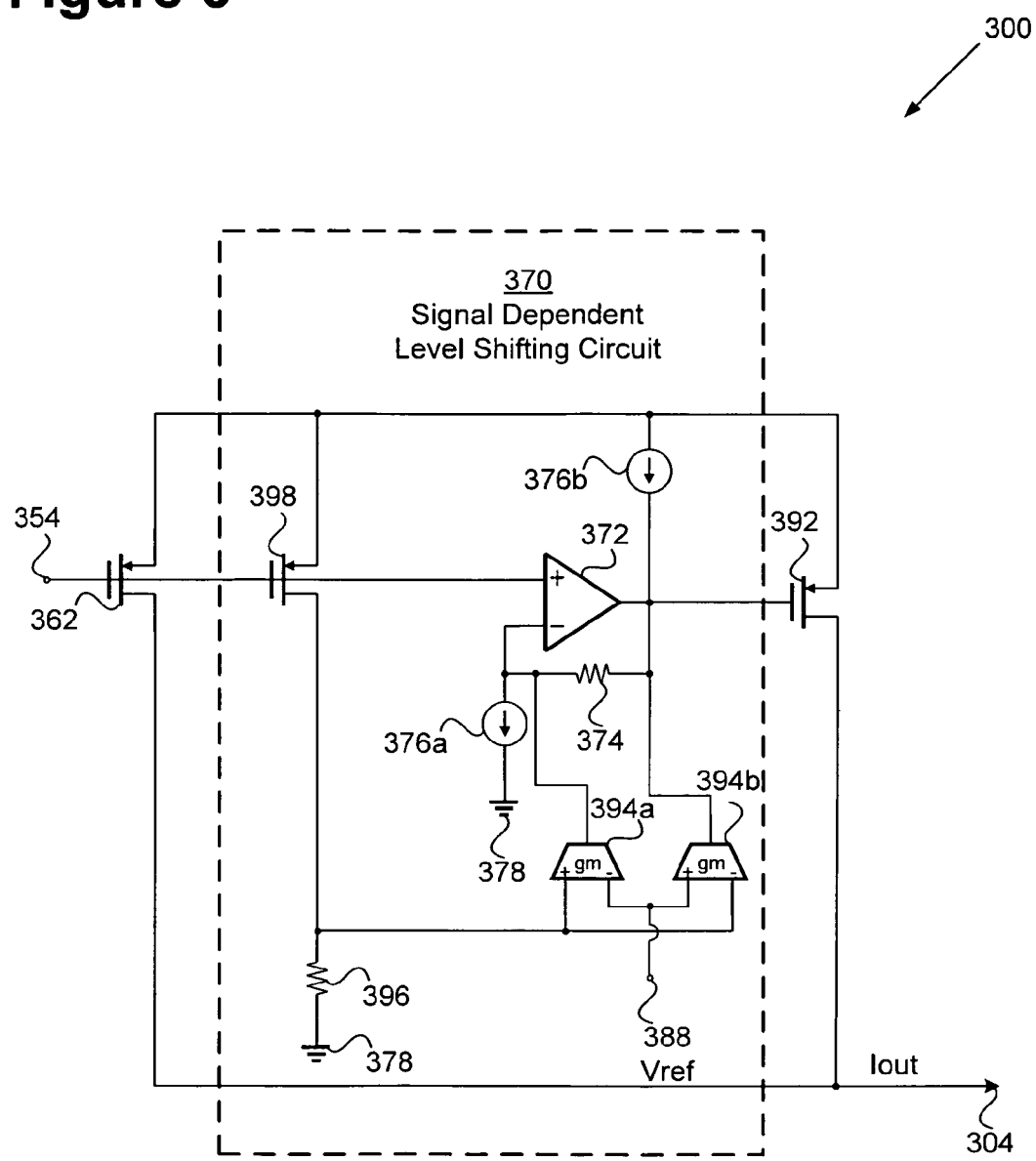
FIG. 3 depicts a signal-dependent level shifting circuit that is suitable for implementation with one embodiment of the present invention.

Turning to amplification system 300 in FIG. 3, an example embodiment of the present invention may include signal-dependent level shifting circuit 370, which is coupled to first-stage amplification device 362 at terminal 354, and which provides a signal-dependent level shift for second-stage amplification device 392. As shown in FIG. 3, signal-dependent level shifting circuit 370 is only intended for level shifting up signal 354 going to the gate of PMOS transistor 392. However, it should be understood that a similar circuit could be employed for level shifting down the gate of an NMOS transistor, such as NMOS transistor 294 in FIG. 2, as for example.

According to the embodiment shown in FIG. 3, signal-dependent level shifting circuit 370 may comprise a scaling circuit to generate a dependent voltage that is proportional to the input signal. For example, signal-dependent level shifting circuit 370 may comprise scaling device 398 and scaling resistor 396, which is coupled to ground terminal 378. Scaling device 398 may be a transistor, such as a MOSFET, and may be sized to handle a current that is proportional to the current flowing through first-stage amplification device 362. The current through scaling resistor 396 may create a dependent voltage across scaling resistor 396 that is, in turn, proportional to the current flowing through first-stage amplification device 362.

Signal-dependent level shifting circuit 370 may also comprise a comparison circuit, for example, a comparison circuit comprising first transconductance block 394a and second transconductance block 394b, that generates a compared signal based on a comparison of the dependent voltage to a reference voltage. First transconductance block 394a may have a positive terminal coupled to scaling resistor 396, and a negative terminal coupled to reference voltage source 388. Second transconductance block 394b may have a positive terminal coupled to reference voltage source 388, and a negative terminal coupled to scaling resistor 396. The resulting compared signal may be detectable at the outputs of transconductance blocks 394a and 394b.

Signal-dependent level shifting circuit 370 may further comprise an adjustment circuit that adjusts the control voltage of the second output stage based on a value of the compared signal. For example, signal-dependent level shifting circuit 370 may comprise operational amplifier 372, feedback resistor 374, first current source 376a, and second current source 376b. A negative input of operational amplifier 372 may be coupled to feedback resistor 374 and first current source 376, which is also coupled to ground terminal 378. A positive input of operational amplifier 372 may be coupled to terminal 354. In one embodiment, operational amplifier 372 may be a unity gain buffer, and the value of feedback resistor 374 and the signal level may determine the amount of adjustment of the control voltage to large amplification device 392. Moreover, the signal dependency may be implemented by selecting the current, resistance, and transconductance values of first current source 376a, feedback resistor 374, and transconductance blocks 394a and 394b in such a way that level shifting occurs only for small signal levels and reduces to a small positive value or a negative value for large signals. Thus, for small signals in which the current in first stage amplification device 362 is small, the voltage at the gate of large second-stage amplification device 392 is smaller than the voltage at terminal 354. For large signals in which the current in first stage amplification device 362 is large, the voltage at the gate of large second-stage amplification device 392 is equal or larger than the voltage at terminal 354.

An embodiment of the present invention may also incorporate a quiescent control circuit into a replica bias circuit to provide an accurate control for the output-stage current, which may be necessary in order to maintain the stability of Class-AB/B amplifier 250. Turning to amplification system 400 in FIG. 4, an embodiment of the present invention may include amplifier 450, which may be a Class-AB or Class-AB/B amplifier, for example, and replica bias circuit 410.

Figure 4:
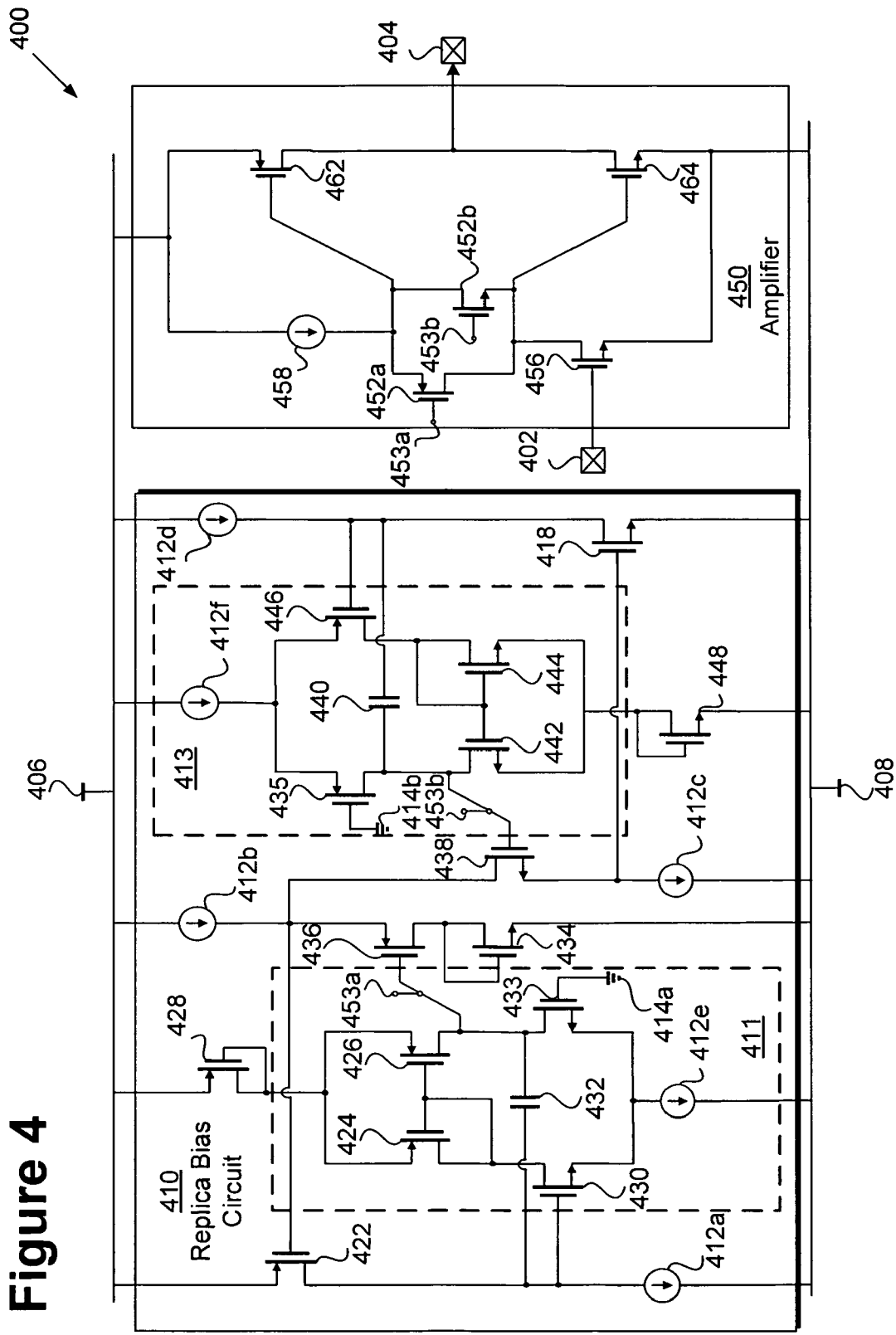
FIG. 4 shows an amplification system that employs a quiescent control circuit in accordance with one embodiment of the present invention.

Amplifier 450 is shown in FIG. 4 in a Class-AB implementation comprising input device 456, first amplification device 462, second amplification device 464, first biasing device 452a, and second biasing device 452b. Any of devices 456, 462, 464, 452a, and 452b may be a MOSFET, for example. First biasing device 452a and second biasing device 452b may couple Class-AB amplifier 450 to replica bias circuit 410 at first biasing terminal 453a and second biasing terminal 453b, respectively.

In this embodiment, replica bias circuit 410 may comprise first replica transistor 422 coupled to first current source 412a; second replica transistor 436 and device 434 series coupled to second current source 412b; third replica transistor 438 coupled to third current source 412c; and fourth replica transistor 418 coupled to fourth current source 412d.

A quiescent control circuit within replica bias circuit 410 may include first active feedback circuit 411 to substantially match the current density of second replica transistor 436 in replica bias circuit 410 to the current density of first biasing device 452a in amplifier 450. First active feedback circuit 411 may comprise device 430 and compensation capacitor 432, which are shown coupled to first current source 412a. First active feedback circuit 411 may further include device 424 and device 426 with a terminal, such as a source, coupled to a common node. Within first active feedback circuit 411, device 433 may have one terminal coupled to ground terminal 414a, another terminal coupled to fifth current source 412e, and a third terminal coupled to compensation capacitor 432. In operation, this configuration may ensure that the quiescent current in first replica transistor 422 and second replica transistor 436 is set accurately as a scaled version of the current flowing into first amplification device 462 and first biasing device 452a, respectively.

Similarly, the quiescent control circuit within replica bias circuit 410 may also include second active feedback circuit 413 to substantially match the current density of third replica transistor 438 in replica bias circuit 410 to the current density of second biasing device 452b in amplifier 450. Second active feedback circuit 413 may comprise device 446 and compensation capacitor 440, which are shown coupled to fourth current source 412d. Second active feedback circuit 413 may further include devices 442 and 444, each with a terminal, such as a source, coupled to a common node. Within second active feedback circuit 413, device 435 may have one terminal coupled to ground terminal 414b, another terminal coupled to sixth current source 412f, and a third terminal coupled to compensation capacitor 440. In operation, second active feedback circuit 413 may ensure that the quiescent current in fourth replica transistor 418 and third replica transistor 438 is set accurately as a scaled version of the current flowing into second amplification device 464 and second biasing device 452b, respectively.

The quiescent control circuit within replica bias circuit 410 may suffer from a systematic offset problem if first level shifting device 428 and second level shifting device 448 are not included in replica bias circuit 410. First level shifting device 428 adds an internal level shift to first active feedback circuit 411. If the current density of first level shifting device 428 matches the current density of first replica transistor 422 and first amplification device 462, then the desired value of internal level shift voltage is added to first active feedback circuit 411 to substantially eliminate the systematic offset. First level shifting device 428 may be, for instance, a MOSFET coupled to first active feedback circuit 411. A first terminal of first level shifting device 428 may be coupled to a supply voltage of replica bias circuit 410, such as positive supply voltage 406. First level shifting device 428 may have second and third terminals, such as gate and drain terminals, coupled in common to first active feedback circuit 411, for example. First level shifting device 428 may add a voltage shift to the output of first active feedback circuit 411, so that the systematic offset of active feedback circuit 411 is substantially eliminated and the quiescent current in first amplification device 462 is set appropriately.

The quiescent control circuit within replica bias circuit 410 may include second level shifting device 448 to add an internal level shift to second active feedback circuit 413. Second level shifting device 448 may be, for example, a MOSFET coupled to second active feedback circuit 413. If the current density of second level shifting device 448 matches the current density of fourth replica transistor 418 and of second amplification device 464, then the desired value of internal level shift voltage is added to second active feedback circuit 415 to substantially eliminate the systematic offset. A first terminal of second level shifting device 448 may be coupled to a supply voltage of replica bias circuit 410, such as negative supply voltage 408. Second level shifting device 448 may have second and third terminals, such as gate and drain terminals, coupled in common to second active feedback circuit 413. Second level shifting device 448 may add a voltage offset to the output of second active feedback circuit 413, so that the systematic offset of active feedback circuit 413 is substantially eliminated and the quiescent current in second amplification device 464 is set appropriately.

Unlike conventional Class-A amplifiers, a Class-AB/B amplifier according to embodiments of the present invention is characterized by high power efficiency. For instance, unlike a conventional Class-A amplifier, the example Class-AB/B amplifiers disclosed herein may deactivate output stage devices during a portion of the span of an input signal and maintain a high operating efficiency. Moreover, the Class-AB/B amplifier embodiment disclosed by the present application also possesses numerous benefits over conventional Class-AB and conventional Class-B amplifiers. More specifically, a small and stable quiescent current may flow through the first output stage devices in presently disclosed Class-AB/B amplifier, ultimately limiting significant cross-over distortion. By employing signal-dependent level shifting, embodiments of the present invention can also be implemented to allow output stage devices to be optimally sized to handle peak load currents.

From the above description, it is manifest that various techniques can be used for implementing the concepts of the present invention without departing from its scope. Moreover, while the invention has been described with specific reference to certain embodiments, a person of ordinary skill in the art would recognize that changes could be made in form and detail without departing from the spirit and the scope of the invention. The described embodiments are to be considered in all respects as illustrative and not restrictive. It should also be understood that the invention is not limited to the particular embodiments described herein, but is capable of many rearrangements, modifications, and substitutions without departing from the scope of the invention.

The invention claimed is:

1. A Class-AB/B amplifier comprising:
   a first output stage including a first plurality of amplification devices, said first output stage operating when said Class-AB/B amplifier is in a quiescent state;
   a second output stage including a second plurality of amplification devices, said second output stage operating when said Class-AB/B amplifier is in an active state;
   a level shifting circuit adjusting a control voltage of said second output stage to activate said second output stage when said Class-AB/B amplifier enters said active state;
   wherein said level shifting circuit includes at least one feedback system.

2. The Class-AB/B amplifier of claim 1, wherein said level shifting circuit implements a fixed level shift.

3. The Class-AB/B amplifier of claim 1, wherein said level shifting circuit comprises a unity gain buffer, and a level shift provided by said level shifting circuit is determined by a circuit element connected in a feedback of said unity gain buffer.

4. The Class-AB/B amplifier of claim 3, wherein said circuit element further comprises a current source and a feedback resistor.

5. The Class-AB/B amplifier of claim 1, wherein said first plurality of amplification devices comprises at least one MOSFET.

6. The Class-AB/B amplifier of claim 1, wherein said second plurality of amplification devices comprises at least one MOSFET.

7. The Class-AB/B amplifier of claim 1, wherein said Class-AB/B amplifier is adapted for use as an audio amplifier.

8. The Class-AB/B amplifier of claim 1, wherein said Class-AB/B amplifier is implemented in a mobile communications device.

9. The Class-AB/B amplifier of claim 1, further comprising a quiescent control circuit to provide a control current for said Class-AB/B amplifier.

10. The Class-AB/B amplifier of claim 1, wherein said level shifting circuit comprises a signal-dependent level shifting circuit to vary said control voltage of said second output stage based on a value of an input signal of said Class-AB/B amplifier.

11. The Class-AB/B amplifier of claim 10, wherein said signal-dependent level shift circuit comprises:
 a scaling circuit creating a dependent voltage proportional to said input signal;
 a comparison circuit generating a compared signal based on a comparison of said dependent voltage to a reference voltage;
 an adjustment circuit adjusting said control voltage based on a value of said compared signal.

12. The Class-AB/B amplifier of claim 10, wherein at least one of said first plurality of amplification devices and said second plurality of amplification devices comprises a MOSFET.

13. The Class-AB/B amplifier of claim 10, wherein said Class-AB/B amplifier is implemented in a mobile communications device.

14. A Class-AB/B amplifier comprising:
 a first output stage including a first plurality of amplification devices;
 a second output stage including a second plurality of amplification devices;
 a level shifting circuit adjusting a control voltage of said second output stage to activate said second output stage when said Class-AB/B amplifier enters an active state
 wherein said level shifting circuit includes at least one feedback system.

15. The Class-AB/B amplifier of claim 14, wherein said level shifting circuit implements a fixed level shift.

16. The Class-AB/B amplifier of claim 14, wherein said level shifting circuit comprises a unity gain buffer.

17. The Class-AB/B amplifier of claim 14, wherein said Class-AB/B amplifier is adapted for use as an audio amplifier.

18. The Class-AB/B amplifier of claim 14, wherein said Class-AB/B amplifier is implemented in a mobile communications device.

* * * * *